(12) United States Patent
Hantschel et al.

(10) Patent No.: US 7,763,794 B2
(45) Date of Patent: Jul. 27, 2010

(54) HETEROJUNCTION PHOTOVOLTAIC CELL

(75) Inventors: Thomas Hantschel, Menlo Park, CA (US); Karl A. Littau, Palo Alto, CA (US); Scott A. Elrod, La Honda, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 1427 days.

(21) Appl. No.: 11/001,330

(22) Filed: Dec. 1, 2004

(65) Prior Publication Data

US 2006/0112985 A1 Jun. 1, 2006

(51) Int. Cl.
*H01L 31/00* (2006.01)
*H01L 25/00* (2006.01)

(52) U.S. Cl. ..................... 136/256; 136/243

(58) Field of Classification Search .......... 136/243–265
See application file for complete search history.

(56) References Cited

U.S. PATENT DOCUMENTS

| | | | |
|---|---|---|---|
| 4,477,688 A | 10/1984 | Barnett et al. | |
| 5,858,457 A | 1/1999 | Brinker et al. | |
| 6,335,480 B1 | 1/2002 | Bach et al. | |
| 2004/0031519 A1 | 2/2004 | Andriessen | |
| 2004/0084080 A1* | 5/2004 | Sager et al. | 136/263 |
| 2004/0095658 A1 | 5/2004 | Buretea et al. | |
| 2004/0103936 A1 | 6/2004 | Andriessen | |
| 2004/0105810 A1 | 6/2004 | Ren et al. | |
| 2004/0118448 A1 | 6/2004 | Scher et al. | |

OTHER PUBLICATIONS

A. Di Paola, L. Palmisano, A.M. Venezia, and V. Augugliaro, Coupled Semiconductor Systems for Photocatalysis. Preparation and Characterization of Polycrystalline Mixed WO3/WS2 Powders, 1999, J. Phys. Chem. B, 103, 8236-8244.*
A. Di Paola, L. Palmisano, M. Derrigo, and V. Augugliaro, Preparation and Characterization of Tungsten Chalcogenide Photocatalysts, 1997, J. Phys Chem. B, 101, 876-883.*
P.S. Nayar and A. Catalano, Zinc phosphide-zinc oxide heterojunction solar cells, 1981, Appl. Phys. Lett., 39(1), 105-107.*
A. Di Paola, L. Palmisano, V. Augugliaro, Photocatalytic behavior of mixed WO3/WS2 powders, 2000, Catalysis Today, 58, 141-149.*
Sirimanne et al., "Photocurrent Enhancement of Wide Bandgap $Bi_2O_3$ by $Bi_2S_3$ Over Layers"; *Solar Energy Materials & Solar Cells* 73 (2002), pp. 175 187, Elsevier Science B.V. 2002.

(Continued)

*Primary Examiner*—Basia Ridley
*Assistant Examiner*—Shannon Gardner
(74) *Attorney, Agent, or Firm*—Fay Sharpe LLP

(57) ABSTRACT

In accordance with one aspect of the present disclosure, a solar photovoltaic device is disclosed. The semiconductor material of the solar photovoltaic device is a heterostructure of two different binary compounds of the same metal. One or both of the two different binary compounds of the same metal are doped so that they have a conduction band edge offset of greater than about 0.4 eV. The binary compound acting as the optical absorbing material of the solar photovoltaic device has a bandgap of about 1.0 eV to about 1.8 eV.

13 Claims, 5 Drawing Sheets

OTHER PUBLICATIONS

Grozdanov et al., "Optical and Electrical Properties of Copper Sulfide Films of Variable Composition," *Journal of Solid State Chemistry* 114, pp. 469-475, 1995.

Patil, et al., "Formation of textured $WS_2$ thin films by van der Waals rheotaxy process and their photoactivity"; *Indian Journal of Pure and Applied Physics* 41 (May 2003), pp. 369-373.

K. Ernst, et al., "Solar Cell With Extremely Thin Absorber on Highly Structured Substrate," Published Apr. 14, 2003 Online at stacks.iop.org/SST/18/475, *Institute of Physics Publishing Ltd., Semiconductor Science and Technology* 18 (2003), pp. 475-479.

Kevin M. Coakley, et al., "Infiltrating Semiconducting Polymers into Self-Assembled Mesoporous Titania Films for Photovoltaic Applications," *Adv. Funct. Mater.* 2003, 13, No. 4, April, pp. 301-306.

B. Das, et al., "High-Efficiency Solar Cells Based on Semiconductor Nanostructures," Department of Computer Science and Electrical Engineering, W.V. University, Morgantown, W.V., received Sep. 25, 1999; *Solar Energy Materials & Solar Cells* 63 (2000) 117-123, Elsevier Science B.V. 2000.

Hideki Masuda, et al., "Highly Ordered Nanochannel-Array Architecture in Anodic Alumina," *Appl. Phys. Lett.* 71 (19), Nov. 10, 1997, *American Institute of Physics*, pp. 2770-2772.

Kornelius Nielsch, et al., "Uniform Nickel Deposition into Ordered Alumina Pores by Pulsed Electrodeposition," *Adv. Mater.* 2000, 12, No. 8, pp. 582-586.

Kevin M. Coakley et al., "Conjugated Polymer Photovoltaic Cells," received Mar. 2, 2004, revised manuscript received Jun. 29, 2004, *American Chemical Society*, published on Web, 10 pgs.

Gong, et al., "Titanium Oxide Arrays Prepared by Anodic Oxidation," *J. Mater. Res.*, vol. 16, No. 12, Dec. 2001, *Materials Research Society*, pp. 3331-3334.

\* cited by examiner

US 7,763,794 B2

HETEROJUNCTION PHOTOVOLTAIC CELL

BACKGROUND

The present disclosure relates to semiconductor devices, and more particularly, to solar photovoltaic cells.

A photovoltaic cell is a component in which light is converted directly into electrical energy.

A heterojunction photovoltaic cell is one in which two dissimilar materials are used to generate band offsets in order to induce charge separation between generated electrons and holes.

A heterojunction photovoltaic cell comprises at least one light-absorbing layer and a charge transport layer, as well as two electrodes. If the converted light is sunlight, the photovoltaic cell is a solar cell.

For solar photovoltaic cells, one would ideally want to use low-cost, non-toxic and abundant source materials and process these materials at low temperature on inexpensive substrates. The mobilities of such materials are often poor. For example, thin film copper oxide (CuO) has a nearly ideal band gap (1.6 eV) for a solar photovoltaic device, but has a low mobility ($<10^{-1}$ $cm^2$/V-sec) when oxidized at about 400-500° C.

Heterojunctions of dissimilar semiconductors are often used to create solar cells. The fabrication process for junctions of dissimilar materials is usually complex, and the manufacturing cost is high.

In this regard, state-of-the-art heterojunction solar cells between dissimilar inorganic semiconductors require very careful engineering in order to avoid carrier recombination at interface states. Often the devices are made using epitaxial techniques in order to insure the quality of the interface. Further, defects in the bulk must be minimized so that electron-hole pairs can propagate to their respective electrodes, which must be separated by at least the absorption length of incident photons.

Thus, the need exists for a photovoltaic cell having a heterojunction of dissimilar semiconductors, which is easily fabricated from low-cost, non-toxic, abundant source materials. The semiconductors are dissimilar inorganic semiconductors that allow for electrons and holes to propagate to the electrodes of the photovoltaic cell.

The present disclosure contemplates a new and improved solar photovoltaic cell and method which overcomes the above-referenced problems and others.

BRIEF DESCRIPTION

In accordance with one aspect of the present disclosure, a solar photovoltaic device is disclosed. The solar photovoltaic device includes a heterostructure of a charge transport material and an optical absorbing material. The charge transport material and the optical absorbing material are different compounds of the same metal. The optical absorbing material has a bandgap of about 1.0 eV to about 1.8 eV. One or both of the charge transport material and optical absorbing material are doped to have a conduction band edge offset of greater than about 0.4 eV. The solar photovoltaic device also includes a first transparent electrode disposed on a top surface of the heterostructure, as well as a second electrode disposed on a bottom surface of the heterostructure.

In accordance with another aspect of the present disclosure, a semiconductor layer for a solar photovoltaic device is disclosed. The semiconductor layer is a heterojunction of a charge transport material and an optical absorbing material. Each of the charge transport material and the optical absorbing material are a different binary compound of the same metal. One or both of the charge transport material and the optical absorbing material are doped to have a conduction band edge offset of greater than about 0.4 eV.

In accordance with yet another aspect of the present disclosure, a method for making a heterojunction of inorganic semiconductors for a solar photovoltaic device is disclosed. A layer of metal is deposited. A first compound of the metal is formed in a depth of the metal layer. A second, different compound of the metal is formed in a depth of the metal layer so as to create a heterojunction between the first compound of the metal and the second compound of the metal.

In accordance with still another aspect of the present disclosure, a method for making a solar photovoltaic device is disclosed. A layer of a first compound of a metal is deposited on a first electrode. A second, different compound of the metal is formed in a depth of the layer to create a heterostructure between the first compound of the metal and the second compound of the metal. A second electrode is formed on the heterostructure.

BRIEF DESCRIPTION OF THE DRAWINGS

The embodiments disclosed herein may take form in various components and arrangements of components, and in various steps and arrangements of steps. The drawings are only for purposes of illustrating embodiments and are not to be construed as limiting the embodiments.

DETAILED DESCRIPTION

Figure 1:
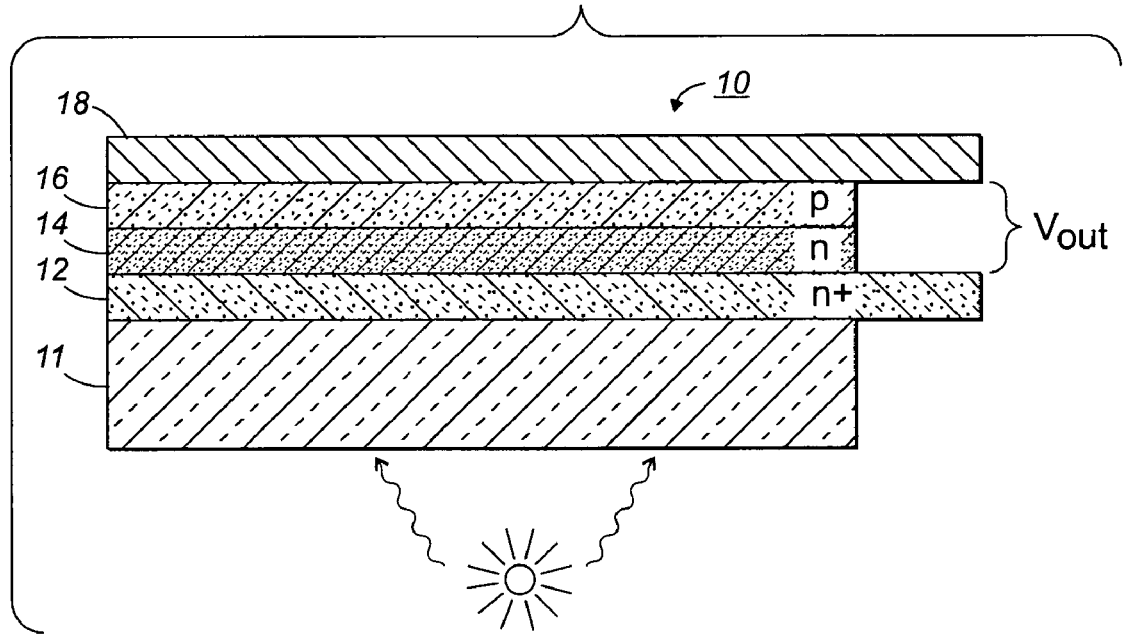
FIG. 1 is a cross-sectional view of a solar photovoltaic cell according to an embodiment of the present disclosure.

Referring now to FIG. 1, a photovoltaic cell 10 is illustrated. The photovoltaic cell 10 is a planar device and includes an electrically conductive support formed of an optically transparent substrate 11 and a transparent electrically conductive film 12.

The material used in the substrate 11 is not particularly limited and can be various kinds of transparent materials, and glass is preferably used.

The material used in the transparent electrically conductive film 12 is also not particularly limited, and it is preferred to use a transparent electrically conductive metallic oxide such as fluorinated tin oxide ($SnO_2$:F), antimony-doped tin oxide ($SnO_2$:Sb), indium tin oxide (ITO), aluminum-doped zinc oxide (AnO:Al) and gallium-doped zinc oxide (ZnO:Ga).

The preferred materials for the transparent electroconductive film 12 are ITO or fluorinated tin oxide.

Examples of the method for forming the transparent electrically conductive film 12 on the substrate 11 include a vacuum vapor deposition method, a sputtering method, a CVD (Chemical Vapor Deposition) method using a component of the material, and a coating method by a sol-gel method. Preferably, the electrically conductive support is formed by sputter depositing ITO on a glass substrate, using process conditions well-known to those of ordinary skill in the art.

Disposed atop the transparent electrically conductive film 12 is a heterojunction of a charge transport material 14 and an optical absorbing material 16.

In order to create the heterojunction, binary compounds of the same metal are used, e.g., the oxide and sulfide of the same metal, or the oxide and phosphide of the same metal. The term metal refers to, in the Periodic Table, elements 21-29 (scandium through copper), 39-47 (yttrium through silver), 57-79 (lanthanum through gold), all elements from 89 (actinium), in addition to aluminum, gallium, indium and tin. The metal is preferably a transition metal.

There are unique cases in which binary compounds of the same metal have the desired band gaps, band alignments and majority carrier type to create a heterojunction of dissimilar inorganic semiconductors which allows for electron-hole splitting and propagation of charges to external electrodes.

Given the proper metal, a heterojunction is created using binary compounds of that metal. One of the compounds acts as an optically-excitable semiconductor (i.e., the optical absorbing material 16), while the second compound acts as a higher bandgap semiconductor used for charge transport (i.e., the charge transport material 14).

Figure 2:
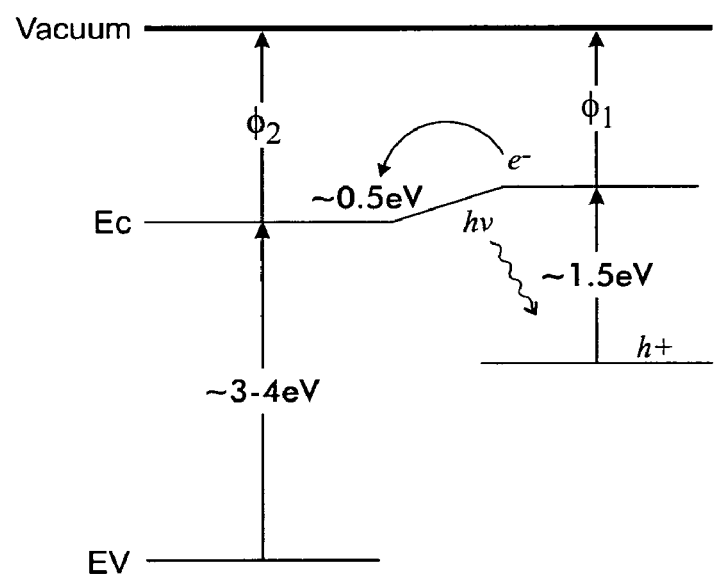
FIG. 2 is a graph showing the bandgap structure for a solar photovoltaic cell according to an embodiment of the present disclosure.

FIG. 2 illustrates the desired bandgap structure for the inhomogeneous solar photovoltaic cell 10 of the present disclosure. As shown in FIG. 2, an ideal bandgap for solar absorption is in the range of about 1.0 eV to about 1.8 eV, and a conduction band edge offset for splitting electron-hole pairs is greater than about 0.4 eV. One example of binary compounds of the same metal satisfying these constraints is tungsten oxide and tungsten sulfide. Specifically, tungsten sulfide has a bandgap of 1.4 eV. In addition, with proper doping, the conduction band edge difference between n-type tungsten oxide and p-type tungsten sulfide can be made greater than 0.4 eV.

Thus, $WO_3$ is an n-type semiconductor, while $WS_2$ is a p-type semiconductor. In this regard, their band alignments and band gaps are suitable for a solar cell device as demonstrated in FIG. 2. The n-type $WO_3$, having a large band gap of approximately 2.7 eV acts as the charge transport material 14 in the solar photovoltaic cell 10 of FIG. 1. The $WS_2$, a p-type material with a band gap of approximately 1.4 eV, acts as the optical absorbing material 16 in the solar photovoltaic cell 10 of FIG. 1.

Another example of a metal having binary compounds satisfying these constraints is zinc. In this regard, zinc oxide (ZnO) is suitable as the charge transport material 14 in the photovoltaic cell 10 of FIG. 1, in this case carrying electrons. Zinc phosphide ($ZnP_2$), on the other hand, is suitable to act as the optical absorbing material 16 of the photovoltaic cell 10 of FIG. 1. In particular, zinc phosphide has a bandgap of approximately 1.3 eV.

Still another example of a metal having binary compounds satisfying these constraints is iron. Iron oxide ($Fe_2O_3$) is suitable as the charge transport material 14, while iron sulfide ($FeS_2$) is a suitable optical absorbing material 16 having a bandgap of approximately 1.0 eV.

Figure 3:
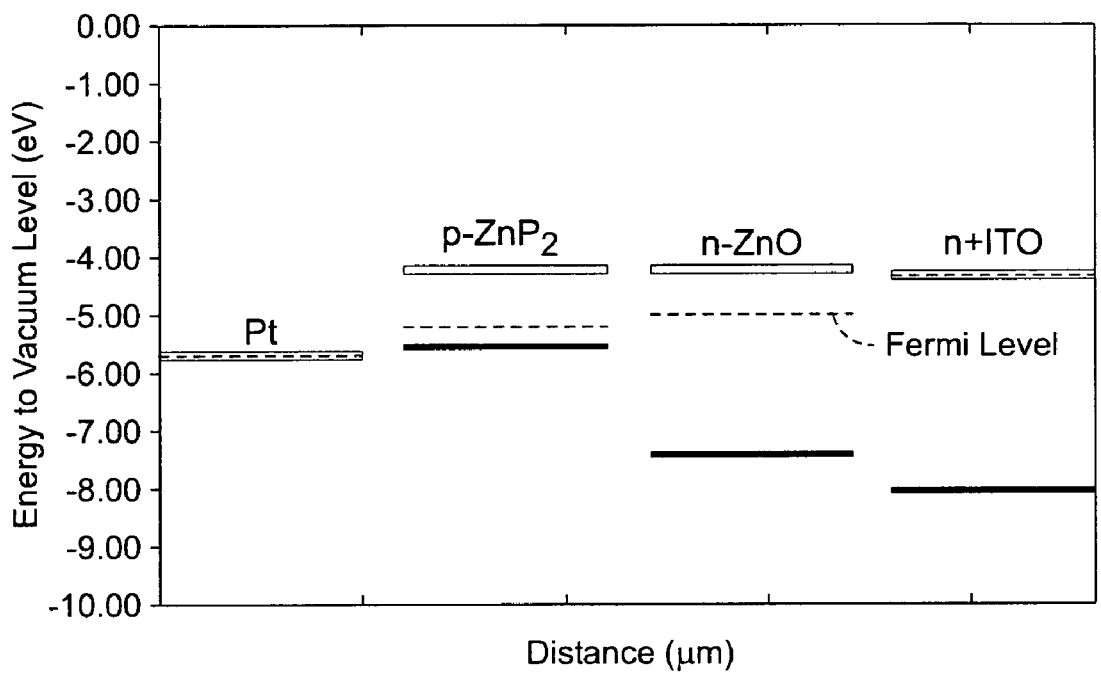
FIG. 3 is a band gap diagram showing the unequilibrated components of a solar photovoltaic cell according to an embodiment of the present disclosure.

As understood by one of ordinary skill in the art, doping of the charge transport material 14 and/or the optical absorbing material 16 is used to create a conduction band edge difference or offset of greater than about 0.4 eV. For example, FIG. 3 corresponds to the unequilibrated components of a heterojunction comprising a transparent n+ ITO, n-type ZnO, p-type $ZnP_2$ and a platinum back electrode. In this particular case, the doping of the ZnO is assumed to place the Fermi level half way between the midpoint of the energy gap and the conduction band edge. Similarly, the $ZnP_2$ is assumed to have its Fermi level half way between the midpoint of its energy gap and the valence band edge. It will be appreciated by those skilled in the art that a wide variation in doping levels can generally be achieved through process conditions used for the material deposition, post-treatment steps like annealing and hydrogenation, and the intentional introduction of impurities.

Figure 4:
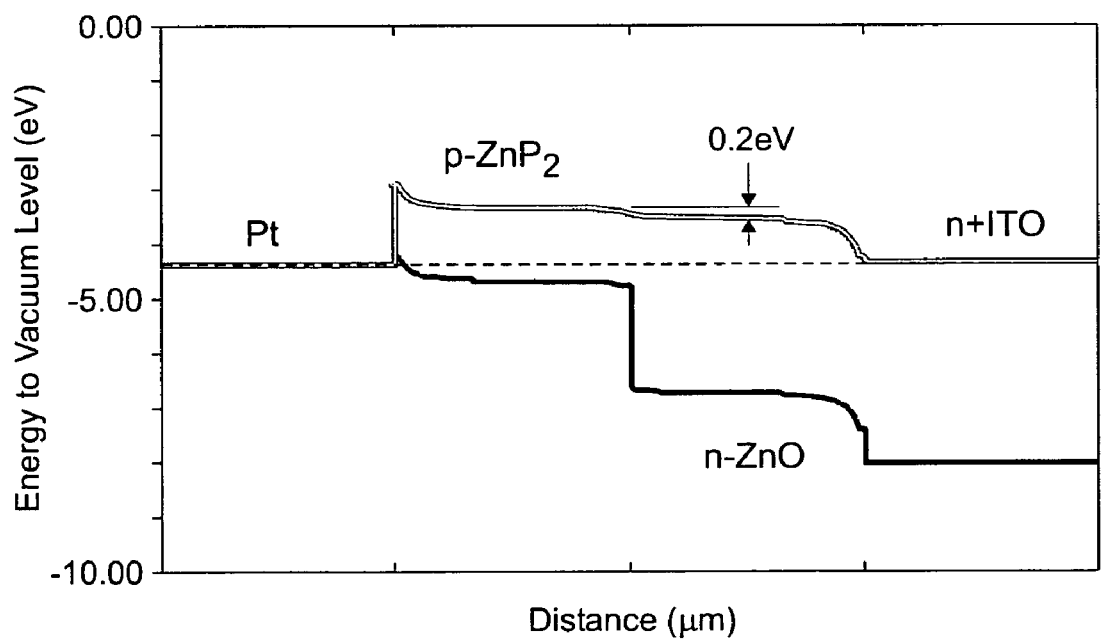
FIG. 4 is a band gap diagram showing the equilibrated components of a solar photovoltaic cell according to an embodiment of the present disclosure.

FIG. 4 shows the positions of the band edges once the materials have been brought into contact and the Fermi levels have equilibrated. For this particular assumption in doping levels, the difference in the conduction band edges between $ZnP_2$ and ZnO is only 0.2 eV, which may be less than what is desirable to split electron-hole pairs at the interface.

Figure 5:
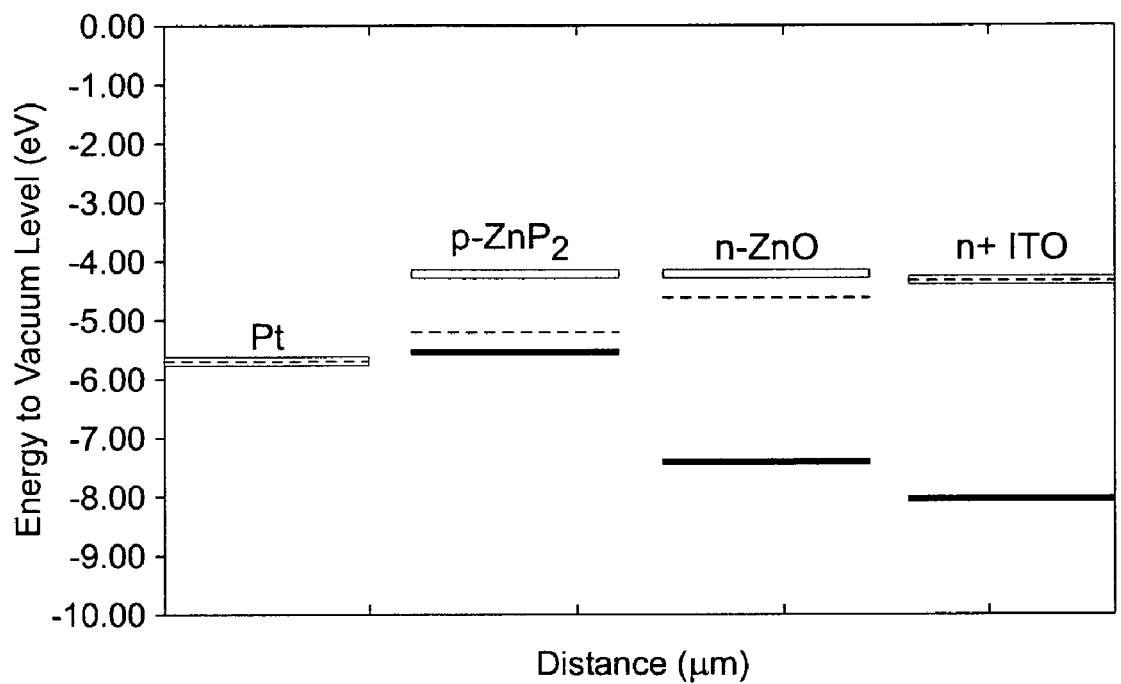
FIG. 5 is a band gap diagram showing the unequilibrated components of a solar photovoltaic cell according to an embodiment of the present disclosure.
Figure 6:
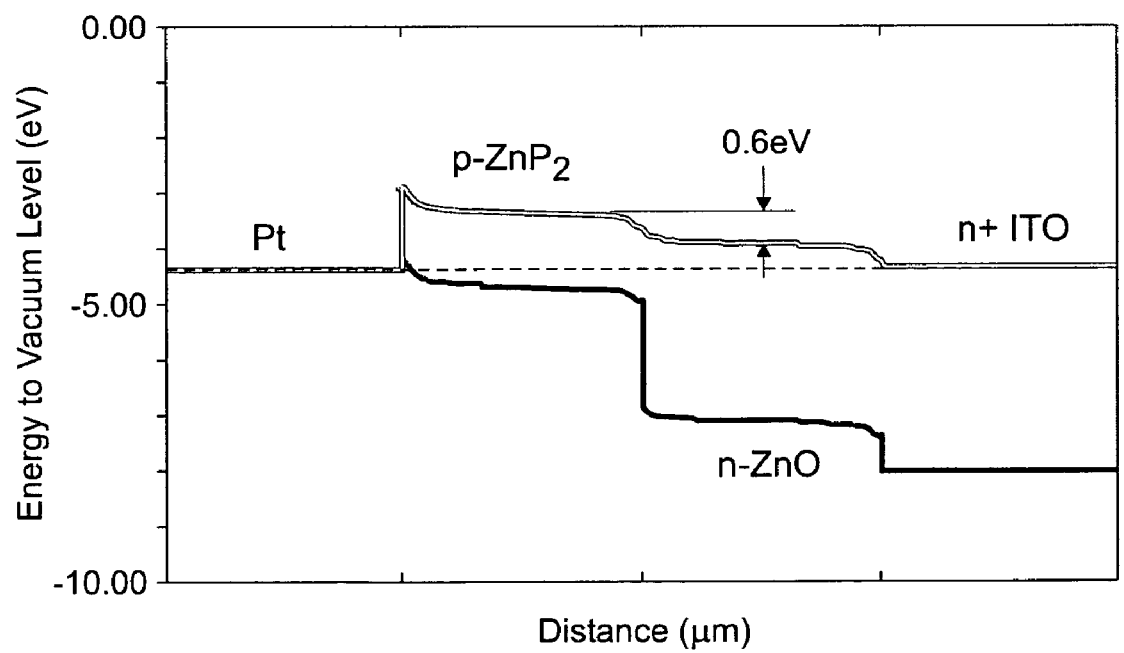
FIG. 6 is a band gap diagram showing the equilibrated components of a solar photovoltaic cell according to an embodiment of the present disclosure.

FIG. 5 shows an unequilibrated case in which the ZnO has been doped more heavily n-type, for example with aluminum as an impurity. The Fermi level is taken to be within approximately 0.4 eV of the conduction band edge. At this doping level in the ZnO, the equilibrated state is shown in FIG. 6, in which the difference in conduction band edges between $ZnP_2$ and ZnO is now 0.6 eV.

Other metals having binary compounds of the same metal (e.g., an oxide and sulfide of the same metal or oxide and phosphide of the same metal) satisfying the constraints illustrated in FIG. 2 may also be used as would be understood by one of ordinary skill in the art.

The formed heterojunction of the photovoltaic cell 10 has both mechanical integrity and film adhesion integrity. In this regard, with specific reference to tungsten, the $WO_3$ layer or charge transport material 14 of FIG. 1 is converted to tungsten sulfide ($WS_2$) through some depth of the layer. This method of processing enables the adhesion of the $WO_3$ layer and the $WS_2$ layer.

In addition, innerdiffusion of atoms is less problematic in the formed heterojunction. Because there is only one metal constituent, there is no migration or diffusion of different metal atoms into the opposite side of the junction, thereby changing properties at the opposite junction.

Figure 7:
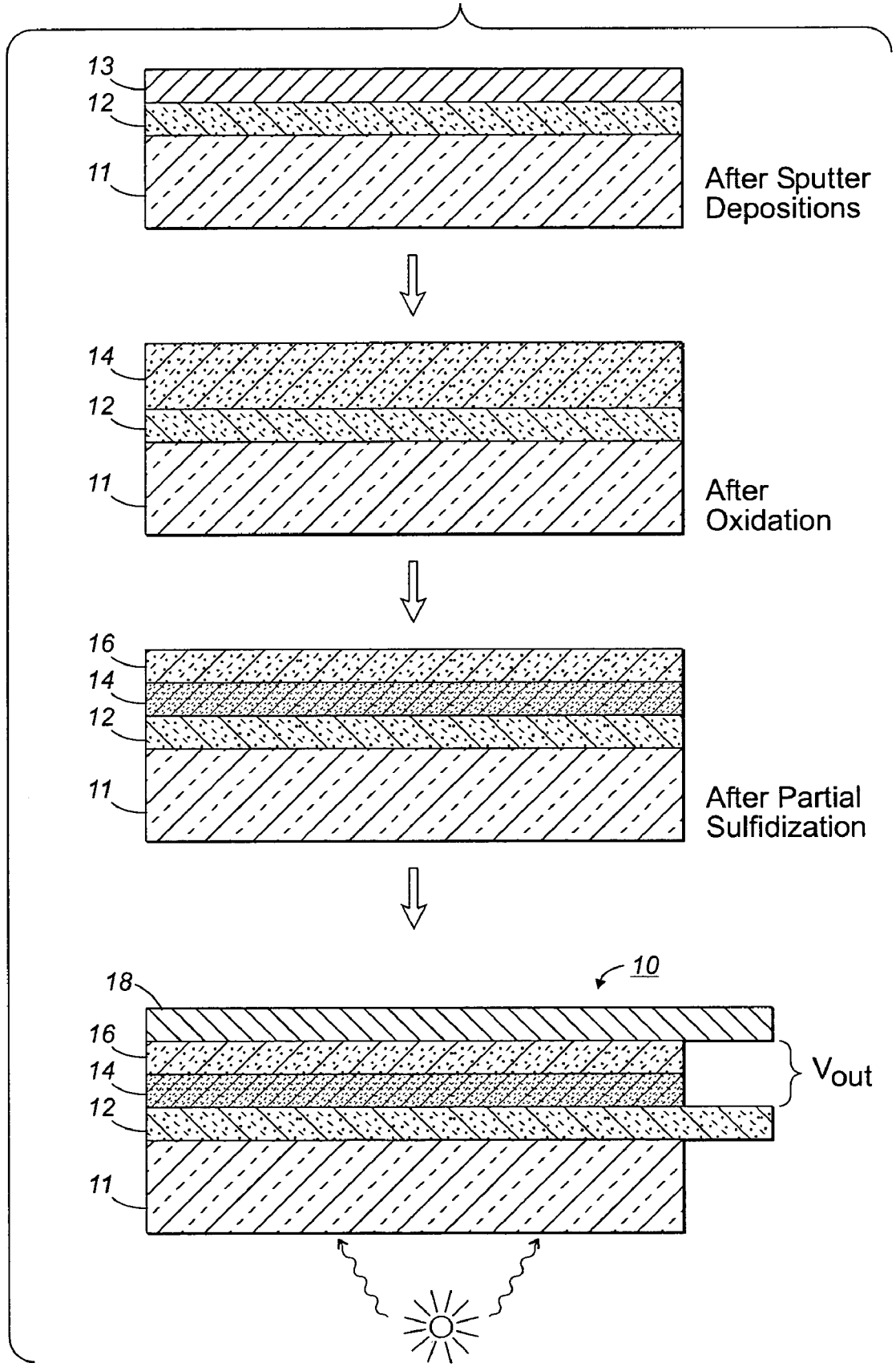
FIG. 7 is a flow chart showing the manufacturing of a solar photovoltaic cell according to an embodiment of the present disclosure.

The process for making the $WO_3/WS_2$ heterojunction for the solar photovoltaic cell 10 is based on either the partial oxidation of a $WS_2$ film or the partial sulfidization of a $WO_3$ film. A representative process flow for the sulfidization of a $WO_3$ film to form the photovoltaic cell 10 is shown in FIG. 7. Of course, the representative process flow illustrated in FIG. 7 would also be utilized for making $Fe_2O_3/FeS_2$ heterojunction for the solar photovoltaic cell 10.

As is illustrated in FIG. 7, a transparent electrically conductive film 12 is sputter deposited on the glass substrate 11 in a manner understood by one of ordinary skill in the art using known process conditions.

A layer of tungsten metal 13 or any other suitable metal like iron or zinc is then sputter deposited on the formed electrically conductive support. The metal has a thickness of about 100 nm to about 1000 nm. The tungsten metal layer is heated on a hot plate or in an oven in dry air or in oxygen at 500° C. for approximately 30 minutes to form a $WO_3$ layer in some depth of the tungsten layer. An iron metal layer is oxidized in a substantially identical manner using a hot plate or an oven in dry air or in oxygen at 500° C. for about 30 minutes. As understood by one of ordinary skill in the art, different oxidation times, oxidation environments and oxidation processes may be used in the oxidation process depending upon the desired results.

The $WO_3$ film is subsequently exposed to a plasma of sulfur to effect partial sulfidization. In this regard, some thickness of the top layer of the $WO_3$ film is converted to $WS_2$ to create the $WO_3/WS_2$ heterojunction. The thickness of the tungsten sulfide layer is preferably about one to three absorption lengths of photons in the optical absorbing material.

There are two primary methods known to one of ordinary skill in the art for exposing the $WO_3$ surface to energetic sulfur atoms—that is energetic to such an extent as to convert the surface from a pure metal or metal oxide—so that sulfidization occurs. One known method is to expose the surface to sulfur vapor in a furnace. For example, with reference to FIG. 7, $WO_3$ is exposed to sulfur vapor in excess of 1000° C. to convert some depth of the surface of the $WO_3$ layer to $WS_2$.

The second known method which can be used in the present disclosure involves exposing the $WO_3$ surface for sulfidization to a plasma containing sulfur in the form of hydrogen sulfide or pure sulfur. $H_2S$ is a gas at room temperature, and $H_2S$ plasma can create the sulfide layer in a depth of the $WO_3$ layer.

As understood by one of ordinary skill in the art, these two methods and corresponding processing conditions would also be used in the case of exposing the $Fe_2O_3$ surface to energetic sulfur atoms.

A pure sulfur plasma is preferred due to the toxicity of the $H_2S$ plasma.

To generate a sulfur plasma, a charge of sulfur is introduced along with the sample into a small hot wall reactor such as a tube furnace or heated bell jar with appropriate electrodes. The unit is heated to generate a sulfur vapor pressure of 1 to 1000 mT. RF energy is supplied to the electrode at sufficient power as known by one of ordinary skill in the art to generate a sustained sulfur plasma.

Hydrogen, argon or other plasma enhancing agents may be added to the gas to ignite and sustain the sulfur plasma or speed the surface reactions. The advantage of plasma reaction is that highly energetic sulfur atoms and molecules can be generated without the need for a higher temperature. The energy of the sulfur atoms is sufficient to convert a layer of surface material to a metal sulfide without any detrimental effect on the film away from the surface. Also, the lower temperature process can be conducted using thin films on a glass substrate. Plasma power or substrate temperature can be varied to control the thickness of the sulfidized layer as is well understood by one of ordinary skill in the art.

FIG. 7 illustrates the flow process for making the solar photovoltaic device 10 based on the sulfidization of the metal oxide film. However, it is understood that photovoltaic cell 10 can also be made by initially sulfidizing the metal film (e.g., tungsten or iron) followed by partial oxidation of the metal sulfide film. As understood by one of ordinary skill in the art, the oxidation process conditions for the partial sulfidization of the metal layer followed by partial sulfidization of the metal layer would be essentially the same as those used in connection with the partial oxidation followed by partial sulfidization of the film.

Another option for forming the $WO_3/WS_2$ heterojunction is to deposit $WS_2$ onto the formed electrically conductive support by directly depositing the compound through thermal evaporation. This method will typically lead to a lower stress film than the case of a metal thin-film that has been converted from the metal. Such a directly evaporated $WS_2$ film can then be partially oxidized to create the photovoltaic junction.

In addition, an $Fe_2O_3/FeS_2$ heterojunction can also be formed by the direct deposition of $FeS_2$ on the formed electrically conductive support by thermal evaporation using processing conditions well-known to one of ordinary skill. The $FeS_2$ film can then be oxidized using known process conditions to create the photovoltaic heterojunction.

Still another option for forming the heterojunction is to directly deposit $WO_3$ or $Fe_2O_3$ through thermal evaporation onto the formed electrically conductive support, and then partially sulfidize the resulting $WO_3$ or $Fe_2O_3$ film. This approach will also typically lead to lower stress than the oxidation and sulfidization of a metal thin-film.

As is also readily appreciated by one of ordinary skill in the art, the process for making the zinc oxide/zinc phosphide heterojunction for the solar photovoltaic cell 10 would also utilize the representative process flow illustrated in FIG. 7. In this regard, a layer of zinc metal 13 is sputter deposited on the formed electrically conductive support. The metal has a thickness of about 100 nm to about 1000 nm. The zinc metal layer is heated on a hot plate or in an oven in dry air or in oxygen at 500° C. for approximately 30 minutes to form a zinc oxide layer in some depth of the zinc layer. As understood by one of ordinary skill in the art, different oxidation times, oxidation environments and oxidation processes may be used in the oxidation process depending upon the desired results.

The zinc oxide film is subsequently exposed to a plasma of phosphorous to effect partial phosphidization. In this regard, some thickness of the top layer of the zinc oxide film is converted to zinc phosphide to create the zinc oxide/zinc phosphide heterojunction. The thickness of the zinc phosphide layer is preferably about one to three absorption lengths of photons in the optical absorbing material.

To generate a plasma of phosphorous, a charge of phosphorous is introduced along with the sample into a small hot wall reactor such as a tube furnace or heated bell jar with appropriate electrodes. The unit is heated to generate a phosphorous vapor pressure of 1 to 1000 mT. RF energy is supplied to the electrode at sufficient power as known by one of ordinary skill in the art to generate a sustained plasma of phosphorous.

Hydrogen, argon or other plasma enhancing agents may be added to the gas to ignite and sustain the sulfur plasma or speed the surface reactions. The advantages of plasma reaction is that highly energetic phosphorous atoms and molecules can be generated without the need for a higher temperature. The energy of the phosphorous atoms is sufficient to convert a layer of surface material to a metal phosphide without any detrimental effect on the film away from the surface. Plasma power or substrate temperature can be varied to control the thickness of the phosphidized layer as is well understood by one of ordinary skill in the art.

Another option for forming the $ZnO/ZnP_2$ heterojunction is to deposit $ZnP_2$ onto the formed electrically conductive support by directly evaporating the compound. This will typically lead to a lower stress film than the case of a metal thin-film that has been converted from the metal. Such a directly evaporated film of $ZnP_2$ can then be partially oxidized to create the photovoltaic junction between $ZnP_2$ and ZnO.

Still another option is would be to deposit ZnO onto the formed electrically conductive support by DC magnetron sputtering in an oxygen atmosphere, and then partially converting the resulting ZnO film to zinc phosphide by partial phosphidization. This approach will also typically lead to lower stress than the oxidation and phosphidization of a metal thin-film.

Electrode 18 is deposited on the photovoltaic device 10 as indicated in FIG. 7. Examples of electrode 18 include platinum, gold, silver, copper, graphite and aluminum. Electrode 18 is deposited using well-known processes, including a vacuum evaporation method, a sputtering method or a CVD (Chemical Vapor Deposition) method.

Figure 8:
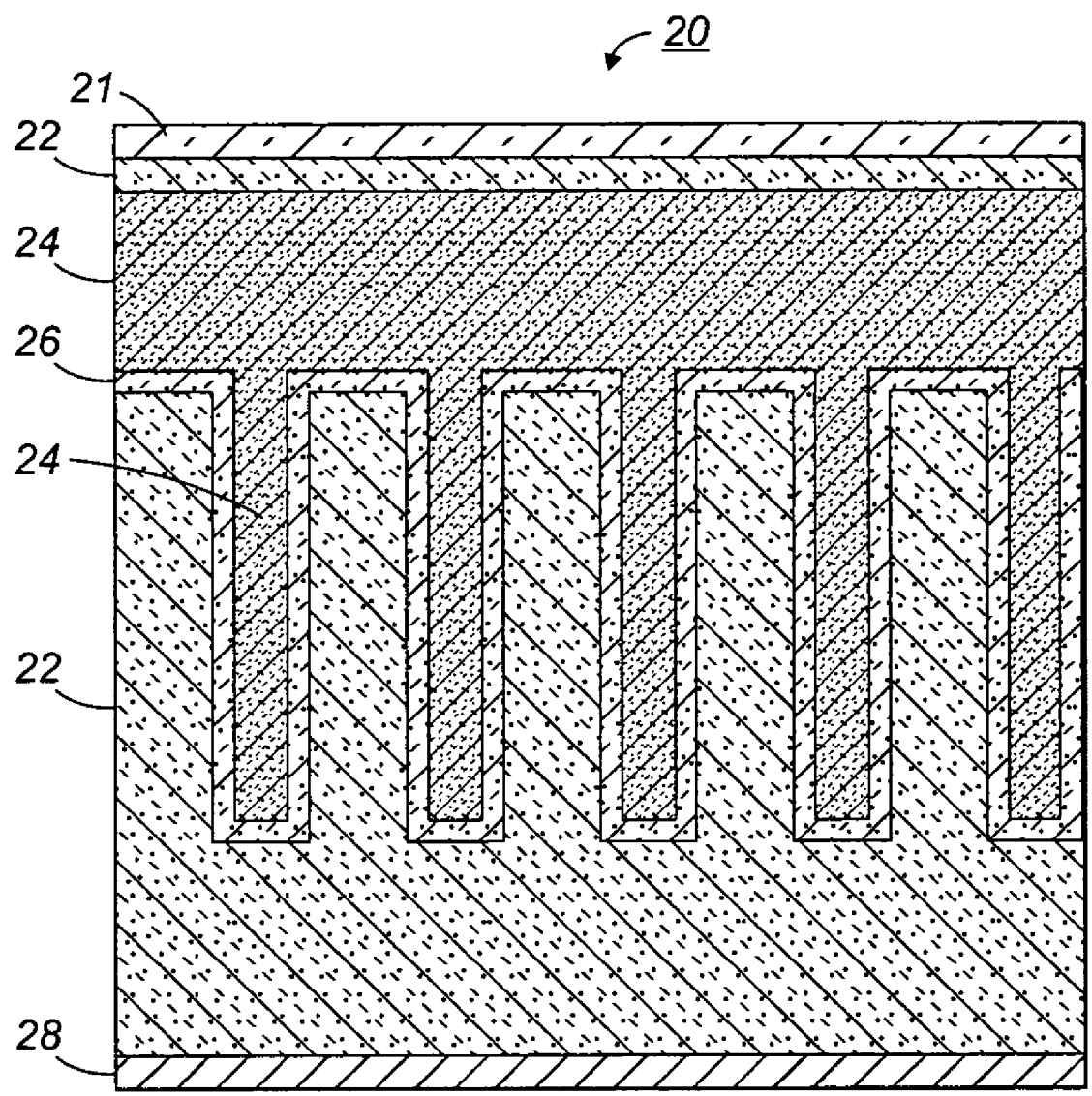
FIG. 8 is a cross-sectional view of a solar photovoltaic cell according to a second embodiment of the present disclosure.

FIG. 8 differs from the embodiment of FIG. 1 in that a solar photovoltaic cell 20 includes a heterojunction of an interdigitated nanostructure of the charge transport material 24 and the optical absorbing material 26. This photovoltaic device is identified in our co-pending application of Elrod et al. (U.S. Ser. No. 10/957,946) entitled "Nanostructured Composite Photovoltaic Cell", filed Oct. 4, 2004, the entire disclosure of which is incorporated herein by reference.

The solar photovoltaic cell 20 is fabricated by sputter depositing a layer of metal on the formed electrically conductive support including the optically transparent substrate 21 and transparent electrically conductive film 22.

In addition, electroplating, CVD or evaporation could be used for forming the layer of the metal on the electrically conductive support. The resultant metal layer has a thickness of about 100 nm to about 1000 nm.

The materials used for the optically transparent substrate 21 and transparent electrically conductive film 22 are identical to those identified for the substrate 11 and conductive film 12 in FIG. 1. The processes for forming the electrically conductive support are also identical to those referenced in connection with FIG. 1.

Anodic oxidation of the metal is used to form charge transport material 24 having discrete, hollow, substantially cylindrical pores. As disclosed by Gong et al. in an article entitled "Titanium Oxide Arrays Prepared by Anodic Oxidation," *J. Mater. Res.*, Vol. 16, No. 12, December 2001 or Masuda et al. in an article entitled "Highly Ordered Nanochannel-Array Architecture in Anodic Alumina," *Appl. Phys. Lett.* 71 (19), 10 Nov. 1997, the disclosures of which are totally incorporated herein by reference, well-aligned metal oxide pore arrays are obtained through anodization in hydrogen fluoride (HF) solution using a well-known process.

The resulting pores are substantially straight, with a controllable pore diameter ranging from 10 to 100 nm; however, as understood by one of ordinary skill in the art, pore diameter is dependent on the desired characteristics of the optical absorber. Preferably, the diameter of the pore is shorter than the recombination distance in the optical absorbing material 26. The resulting pores also include a high aspect ratio (i.e., depth/width). For example, the aspect ratio of the pores ranges from about 3:1 to about 10:1.

With reference to $WO_3$ as the charge transport layer 24, high-purity (99.99%) tungsten is first sputter deposited on the electrically conductive film 12. Alternatively, the tungsten can be deposited by electroplating, CVD or evaporation using process conditions well-known to one of ordinary skill in the art.

The anodization is then conducted at room temperature (18° C.) with magnetic agitation. The aqueous solution contains from 0.5 to 3.5 wt. % HF. As is readily understood by one of ordinary skill in the art, different anodization temperatures, HF concentrations and chemical solutions can be used for the anodization step depending upon the desired outcome.

The anodizing voltages are preferably kept constant during the entire process but may be changed during the anodizing step. At increased voltages, discrete, hollow, substantially parallel and cylindrical pores appear in the tungsten oxide films. In particular, tungsten oxide pore arrays are obtained under anodizing voltages ranging from 10-40 volts as dependant on the HF concentration, with relatively higher voltages needed to achieve the tube-like structures in more dilute HF solutions.

If desired, a second oxidation step can be performed to ensure that the charge transport material 24 is fully oxidized as illustrated in FIG. 8, and as a wide bandgap semiconductor, transparent to most of the solar spectrum.

As appreciated by one of ordinary skill in the art, the same anodization techniques would be carried out for the anodization of zinc to use zinc oxide or another suitable metal such as iron oxide as the charge transport layer 24.

With reference to FIG. 8, the regular structure allows for optimization of the pitch with respect to the charge collection distance.

The oxide of the metal making up the charge transport material 24 is reacted to form a second binary compound of the metal so that the oxide of the metal and second binary compound of the metal form a heterojunction.

With specific reference to FIG. 8, the top layer of tungsten oxide or iron oxide in the charge transport material 24 is sulfidized by exposure to sulfur vapor in a furnace in excess of about 1000° C. to convert some depth of the tungsten to tungsten sulfide.

Another known method involves exposing the structure to a plasma containing sulfur in the form of hydrogen sulfide or pure sulfur. $H_2S$ is a gas at room temperature and can be used to generate a plasma forming tungsten sulfide. $H_2S$ is problematic due to its toxicity.

In place of $H_2S$, a pure sulfur plasma could be used. The sulfur plasma is generated by introducing a charge of sulfur along with the sample into a small hot wall reactor such as a tube furnace or heated bell jar with appropriate electrodes. The unit is heated to generate a sulfur vapor pressure of 1 to 1000 mT. RF energy is supplied to the electrode at sufficient power as known by one of ordinary skill in the art.

Hydrogen, argon or other plasma enhancing agents may be added to the gas to ignite and sustain the sulfur plasma or speed the surface reactions. The advantages of plasma reaction is that highly energetic sulfur atoms and molecules can be generated without the need for a higher temperature. The energy of the sulfur atoms is sufficient to convert a layer of surface material to a metal sulfide without any detrimental effect on the film away from the surface. Plasma power or substrate temperature can be varied to control the thickness of the sulfidized layer as is well understood by one of ordinary skill in the art.

In the event the transition metal used in the photovoltaic device 20 is zinc, the resultant interdigitated nanostructure is exposed to a plasma of phosphorous. The process and processing conditions would be like those described in connection with the sulfur plasma as understood by one of ordinary skill in the art.

As shown in FIG. 8, the remaining unfilled areas of the pores in the charge transport material 24 are filled with the transparent electrically conductive film 22.

Alternatively, the pores in the charge transport material 24 of FIG. 8 may be partially or wholly filled with the same metal initially deposited on the electrically conductive film 22 using processes well-known and understood to those of ordinary skill in the art prior to forming the heterojunction. Such processes for filling the pores of the charge transport material 24 (e.g., $WO_3$, $Fe_2O_3$ or ZnO), include sputtering, electroplating, electroless plating, reflow CVD and evaporation.

For example, a transition metal such as tungsten, iron or zinc can be easily sputtered and, using well-known plasma conditions, such as high-density plasma (HDP) sputtering with large substrate bias, the metal atoms can be directed normal to the incident surface. Moderate aspect ratios such as 2:1 or 3:1 or even higher can be filled using sputtering.

In HDP sputtering the argon working gas is excited into a high-density plasma, which is a plasma having an ionization density of at least $10^{11}$ cm$^{-3}$ across the entire space the plasma fills except the plasma sheath. Typically, an HDP sputter reactor uses an RF power source connected to an inductive coil adjacent to the plasma region to generate the high-density plasma. The high argon density causes a significant fraction of sputtered atoms to be ionized. If the pedestal electrode supporting the device being sputter coated is negatively electrically biased, the ionized sputter particles are accelerated toward the device to form a directional beam that reaches deeply into the narrow holes.

Electrochemical deposition or electroplating is another suitable production method for depositing a transition metal such as tungsten, iron or zinc into trenches and vias and can be used for filling the pores of the charge transport material 24 with the tungsten, iron or zinc metal. High aspect ratio filling is accomplished as is well-known to those of skill in the art using additives to the electroplating bath such as accelerants (e.g., sulfur-containing compounds) and surfactants (e.g., nitrogen-containing compounds) to enhance growth at the bottom and suppress it near the top. As is well understood in the art, electroplating requires a continuous seed layer in order to supply the required voltage across the entire substrate.

In this regard, a tungsten, iron or zinc seed layer is deposited using, e.g., physical vapor deposition (PVD) methods, and the seed layer is typically deposited on a barrier layer. A seed layer deposition may require a pre-clean step to remove contaminants. The pre-clean step could be a sputter etch using an argon plasma, typically performed in a process chamber separate from the PVD chamber used to deposit the seed layer.

Electroless plating techniques can also be used to fill the charge transport material 24. The reaction is preferably driven by a redox reaction in the bath allowing plating on isolated features. The reaction is naturally selective and will only plate tungsten, iron or zinc on itself or an activated surface such as $WO_3$, $Fe_2O_3$ or ZnO.

A typical electroless metal plating solution comprises a soluble ion of the metal to be deposited, a reducing agent and such other ligands, salts and additives that are required to obtain a stable bath having the desired plating rate, deposit morphology and other characteristics. Common reductants include hypophosphite ion, formaldehyde, hydrazine or dimethylamine-borane. The reductant reacts irreversibly at the catalyst core to produce an active hydrogen species. The choice of electroless metal plating solution is determined by the desired properties of the deposit, such as conductivity, magnetic properties, ductility, grain size and structure and corrosion resistance.

If the charge transport material 24 is heated to a temperature where tungsten, iron or zinc has significant surface mobility, pores may be filled by diffusion of the tungsten, iron or zinc atoms. This reflow process can be done in situ. If the feature is lined with a thin tungsten, iron or zinc layer such as from CVD, sputtering more tungsten, iron or zinc on the feature at temperatures of 300° to 400° C. can lead to filled pores. High aspect ratio holes can be filled in this manner.

Tungsten, iron or zinc CVD can also be used for filling of the pores of the charge transport layer 10 using inorganic or metal-organic precursors. For example, in the case of tungsten, tungsten hexafluoride ($WF_6$) is the main precursor used and is commercially available. The reaction requires reduction of $WF_6$ to W using an appropriate reducing agent such as hydrogen ($H_2$) or silane ($SiH_4$). Metal organic sources for zinc deposition are also available. The film can be quite conformal even at high aspect ratios. Selective methods of deposition are possible where the reaction only takes place on active sites, such as an exposed metal pad. This process allows "bottom up" filling of very high aspect ratio pores.

After filling of the pores of the charge transport material 24 with metal, the resultant inter-digitated structure is sulfidized in the case of tungsten and iron or phosphidized in the case of zinc to create a heterostructure between the charge transport material 24 and the optical absorbing material 26. The partial sulfidization or partial phosphidization process is carried out in the same manner as set out in connection with the solar photovoltaic device 20 of FIG. 8. Because the metal can be more readily sulfidized or phosphidized than its oxide, the conversion to a metal sulfide or phosphide will occur principally to the metal that has been used to fill the pores.

Electrode 28 is deposited on the photovoltaic device 20 as indicated in FIG. 8. Examples of electrode 28 include platinum, gold, silver, copper, graphite and aluminum. Electrode 28 is deposited using well-known processes, including a vacuum evaporation method, a sputtering method or a CVD (Chemical Vapor Deposition) method.

Including the substrate, the photovoltaic cell 10, 20 in FIGS. 1 and 8 has a thickness of from about 0.5 mm to about 2.0 mm.

To avoid reflection losses, the bottom side of the photovoltaic cell 10, 20, in FIGS. 1, 7 and 8 can be provided with an antireflection coating having one, two, or more layers.

To increase the light yield, the reverse side of the photovoltaic cell 10, 20 in FIGS. 1, 7 and 8 can be constructed in such a way that light is reflected back into the cell.

Another embodiment would be to use concentrated sunlight to improve the solar cell efficiency, for example, by using mirrors or Fresnel lenses.

The cells of the embodiments of this disclosure can also be part of a tandem cell; in such devices a plurality of subcells convert light from different spectral regions into electrical energy.

While particular embodiments have been described, alternatives, modifications, improvements, equivalents, and substantial equivalents that are or may be presently unforeseen may arise to applicants or others skilled in the art. Accordingly, the appended claims as filed and as they may be amended are intended to embrace all such alternatives, modifications, variations, improvements and substantial equivalents.

The invention claimed is:

1. A solar photovoltaic device which comprises:
    a heterostructure of a charge transport material and an optical absorbing material, the charge transport material is composed of tungsten oxide and the optical absorbing material is composed of tungsten sulfide, the optical absorbing material having a bandgap of about 1.4 eV, one or both of the charge transport material and optical absorbing material being doped to produce a conduction band edge offset of greater than about 0.4 eV;
    a first transparent electrode disposed on a top surface of the heterostructure, directly above and in contact with the optical absorbing material; and
    a second electrode disposed on a bottom surface of the heterostructure, directly beneath and in contact with the charge transport material.

2. The solar photovoltaic device of claim 1, wherein the device is planar.

3. The solar photovoltaic device of claim 1, wherein the device is an interdigitated heterostructure nanostructure of the charge transport material and the optical absorbing material.

4. A semiconductor layer for a solar photovoltaic device which comprises:
a heterojunction of a charge transport material containing a substantially straight array of discrete, hollow and substantially cylindrical metal oxide pores, each pore with a depth to width radio from about 3:1 to about 10:1 and a diameter ranging from about 10 nm to about 100 nm, wherein the diameter of each pore is shorter than a recombination distance in an optical absorbing material, each of the charge transport material and the optical absorbing material are composed of a different binary compound of the same metal, the optical absorbing material being tungsten sulfide having a bandgap of about 1.4 eV and the charge transport material being tungsten oxide, one or both of the charge transport material and the optical absorbing material doped to have a conduction band edge offset of greater than about 0.4 eV.

5. A solar photovoltaic device which comprises:
a heterostructure of a charge transport material and an optical absorbing material, the charge transport material and the optical absorbing material composed of different compounds of the same metal, the optical absorbing material being composed of tungsten sulfide having a bandgap of about 1.4 eV and the charge transport material being tungsten oxide, one or both of the charge transport material and optical absorbing material being doped to have a conduction band edge offset of greater than about 0.4 eV;
a first transparent electrode disposed on a top surface of the heterostructure, directly above and in contact with the optical absorbing material; and
a second electrode disposed on a bottom surface of the heterostructure, directly beneath and in contact with the charge transport material.

6. The solar photovoltaic device of claim 1, wherein the tungsten oxide charge transport material contains a heterojunction of a charge transport material contains a substantially straight array of discrete, hollow and substantially cylindrical metal oxide pores.

7. The solar photovoltaic device of claim 6, wherein the substantially cylindrical metal oxide pores each have a depth to width radio from about 3:1 to about 10:1.

8. The solar photovoltaic device of claim 6, wherein the substantially cylindrical metal oxide pores have a diameter ranging from about 10 nm to about 100 nm.

9. The solar photovoltaic device of claim 6, wherein the substantially cylindrical metal oxide pores each have a diameter which is shorter than a recombination distance.

10. The solar photovoltaic device of claim 1, wherein one or both of the charge transport material and the optical absorbing material doped to have a conduction band edge offset of greater than about 0.4 eV.

11. The semiconductor layer of claim 5, wherein the charge transport material contains a substantially straight array of discrete, hollow and substantially cylindrical metal oxide pores.

12. The semiconductor layer of claim 11, wherein the metal oxide pores are of a depth to width radio from about 3:1 to about 10:1.

13. The semiconductor layer of claim 11, wherein the metal oxide pores are of a diameter ranging from about 10 nm to about 100 nm, and the diameter of each pore is shorter than a recombination distance.

* * * * *